(12) United States Patent
Lunde et al.

(10) Patent No.: US 6,522,161 B2
(45) Date of Patent: Feb. 18, 2003

(54) METHOD AND APPARATUS FOR PROPERLY DISABLING HIGH CURRENT PARTS IN A PARALLEL TEST ENVIRONMENT

(75) Inventors: Aron T. Lunde, Boise, ID (US); Phillip A. Rasmussen, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/898,047

(22) Filed: Jul. 5, 2001

(65) Prior Publication Data

US 2002/0049941 A1 Apr. 25, 2002

Related U.S. Application Data

(62) Division of application No. 09/236,649, filed on Jan. 26, 1999, now Pat. No. 6,275,058.

(51) Int. Cl.[7] .............................................. G01R 31/26
(52) U.S. Cl. .................................... 324/765; 324/158.1
(58) Field of Search ................................ 324/754, 760, 324/763, 765, 73.1, 158.1; 714/8, 41, 710; 340/825.79, 825.84

(56) References Cited

U.S. PATENT DOCUMENTS

| 4,379,259 | A |   | 4/1983  | Varadi et al. |
|-----------|---|---|---------|---------------|
| 5,500,588 | A |   | 3/1996  | Worley |
| 5,537,108 | A |   | 7/1996  | Nathan et al. |
| 5,539,325 | A | * | 7/1996  | Rostoker et al. ............ 324/763 |
| 5,679,609 | A |   | 10/1997 | Aimi et al. |
| 5,726,482 | A |   | 3/1998  | Nathan et al. |
| 5,966,021 | A |   | 10/1999 | Eliashberg et al. |
| 5,994,915 | A | * | 11/1999 | Farnworth et al. .......... 324/763 |
| 5,996,096 | A |   | 11/1999 | Dell et al. |
| 6,275,058 | B1| * | 8/2001  | Lunde et al. ............. 324/158.1 |
| 6,313,658 | B1| * | 11/2001 | Farnworth et al. .......... 324/765 |

\* cited by examiner

*Primary Examiner*—Michael Sherry
*Assistant Examiner*—Minh N. Tang
(74) *Attorney, Agent, or Firm*—Dickstein Shapiro Morin & Oshinsky

(57) ABSTRACT

A parallel test system and method for testing integrated circuit devices which can reliably prevent devices that should not be active due to a blown fuse from generating random data signals which can adversely impact the test results of other chips being tested are disclosed. The state of each fuse that protects a respective socket on a test board is determined by a controller, such as an Application Specific Integrated Circuit (ASIC), built onto the test board. When it is determined that a specific fuse is open, i.e., the fuse has blown due to a high current condition, the device inserted into the socket protected by the fuse will have its I/O lines disabled by the controller, thereby effectively shutting off the device completely and preventing it from generating and transmitting random data to the test device.

31 Claims, 7 Drawing Sheets

FIG. 2 -PRIOR ART-

METHOD AND APPARATUS FOR PROPERLY DISABLING HIGH CURRENT PARTS IN A PARALLEL TEST ENVIRONMENT

This patent application is a divisional application of U.S. patent application Ser. No. 09/236,649, filed on Jan. 26, 1999, now U.S. Pat. No. 6,275,058 entitled METHOD AND APPARATUS FOR PROPERLY DISABLING HIGH CURRENT PARTS IN A PARALLEL TEST ENVIRONMENT.

BACKGROUND OF THE INVENTION

1. Field of the Invention

The present invention relates generally to integrated circuits, and more particularly to a test method and apparatus for burn-in testing of integrated circuits in a parallel test environment.

2. Description of the Related Art

It is well known in the field of integrated circuit (IC) devices that proper testing during and after fabrication is important to improving the reliability and yield of product shipped to customers. During manufacture by the chip maker, ICs typically undergo three separate test cycles: (1) in-process testing, such as continuous monitoring of sheet resistivities, junction depths, and other pertinent device parameters, such as current gain and voltage breakdown; (2) preliminary electrical testing called the wafer-probe test which is performed prior to the scribing and die separation steps; and (3) a detailed fuel testing of reliability and performance after the completion of the fabrication and packaging steps.

The testing of ICs is one of the more expensive and time consuming stages of the manufacturing process. It is desirable to keep testing costs low, since these add directly to the cost of producing the parts. However, the cost of testing cannot be lowered too far, as doing so comes at the expense of product reliability.

Automatic high-speed testing is practically mandatory to the final testing of modern ICs because a large number of complex tests are required to check even the simplest types of circuits. The testing is typically performed by a memory controller or processor (or a designated processor in a multi-processor machine) which runs a testing program.

Random access memory (RAM) integrated circuits, such as DRAMs and the like, include an array of memory cells arranged in rows and columns. Detailed final testing of reliability and performance after the completion of the fabrication and packaging steps is typically performed to determine whether there is an actual or latent defect in one or more of the memory cells which would render a memory unreliable. For example, to determine if a hidden defect exists, random access memories are typically subjected to data retention tests and/or data march tests. In data retention tests, every cell of the memory is written and checked after a prespecified interval to determine if leakage current has occurred that has affected the stored logic state. In a march test, a sequence of read and/or write operations is applied to each cell, either in increasing or decreasing address order. To determine if there is a defect in the array of bits that may fail over time, burn-in testing is typically performed to accelerate failure using voltage and temperature stress. When a failed memory cell is detected through testing, the column or row in which the failed memory cell is located is typically substituted by a redundant column or row of memory cells.

In order to reduce the time required to perform the testing of memory chips, the testing process is performed on a plurality of memory devices simultaneously. FIG. 1 illustrates in block diagram form a conventional testing system 20 used to perform tests on integrated circuits such as memory devices. Test system 20 may include a controller 22 which controls a test device 24. Controller 22 may include a microprocessor, such as a general purpose single- or multi-chip microprocessor. In addition, the microprocessor may be any conventional special purpose microprocessor such as a digital signal processor or a graphics processor. Signals between the controller 22 and test device 24 are sent via communication path 23. Test device 24 is connected, via communication path 25, to a device under test (DUT) board 26. DUT 26 contains the memory devices being tested, and can be placed separate from test device 24 in order to perform environmental testing if desired. For example, burn-in testing is typically performed at an elevated ambient temperature in a thermal chamber. Power supply 30 supplies power (Vcc) to DUT 26 for operation via conductor 32.

FIG. 2 illustrates in block diagram form the DUT 26 of FIG. 1. DUT 26 includes a plurality of sockets 40 into which the items being tested, such as memory chips, are inserted. Each socket 40 is connected to a power source Vcc from power supply 30 via conductor 42. A fuse 44 or other protective device is provided between each socket 40 and Vcc conductor 42. Each socket 40 receives signals from and sends signals to test device 24 via bus lines 46, 48 and 50. These signals may include input/output (I/O) signals, address signals, and so forth as are necessary for a memory chip inserted in socket 40 to be properly tested.

The operation of test system 20 is as follows. A memory chip may be inserted into each socket 40. Each memory chip is powered by a supply voltage Vcc through fuse 44 from power supply 30. Controller 22 executes a program to control test device 24 to run through a test sequence. Test device 24, in response to the signals from controller 22, performs various tests on each memory device on DUT 26, such as data retention, data march, and burn-in tests previously described. Based on the results of the tests performed, test device 24 determines if a memory device on DUT 26 is faulty. Each fuse 44 provides protection for its respective socket 40 and also DUT 26 in the case where a fault in the memory chip causes an over-current condition. If the fuse 44 opens due to some high current fault condition, power to the respective socket 40 is interrupted and the device inserted into socket 40 will not operate, despite the signals being sent to it from test device 24 via bus lines 50, 48 and 46.

There are problems, however, with the conventional test system as described with respect to FIGS. 1 and 2. Certain types of memory chips, such as for example a Synchronous DRAM (SDRAM) and the like, may still partially operate even if the fuse 44 of the socket 40 into which the chip is inserted has operated and is blown. For example, the signals from test device 24 on the address and I/O lines via bus lines 50, 48 and 46 may provide sufficient power to a SDRAM to keep the chip partially active even if the power source Vcc is interrupted by the opening of fuse 44. In this partially active state, the chip may not operate normally and may cause erroneous signals on the shared bus lines 48, 50. Specifically, the chips may still maintain the ability to generate data at random times, such as for example a strong logic zero, and output it to test device 24. Test device 24 may interpret this randomly generated data signal as indicating a failed test on one of the otherwise good chips on DUT 26, or alternatively may interpret the randomly generated data signal as indicating a passed test on one of the other wise faulty chips. These erroneous interpretations may lead to faulty chips not being repaired or good chips being rejected, and may significantly decrease the efficiency of the test system and corresponding reliability of the memory devices being sent to customers.

Thus, there exists a need for an apparatus and method for testing IC devices which can reliably prevent chips that should not be active due to a blown fuse from generating random data signals which can adversely impact the test results of other chips being tested.

SUMMARY OF THE INVENTION

In accordance with the present invention, a test system and method are described and illustrated which do not exhibit the drawbacks associated with the previous test systems. According to the present invention, the state of the fuse that protects each socket is determined by a controller, such as an Application Specific Integrated Circuit (ASIC), built onto the test board. When it is determined that a specific fuse is open, i.e., the fuse has blown due to some high current fault condition, the part inserted into the socket protected by the fuse will have its I/O lines disabled by the controller, thereby effectively shutting off the part completely and preventing it from generating and transmitting random data signals to the test device.

These and other advantages and features of the invention will become apparent from the following detailed description of the invention which is provided in connection with the accompanying drawings.

DETAILED DESCRIPTION OF THE PREFERRED EMBODIMENTS

Figure 1:
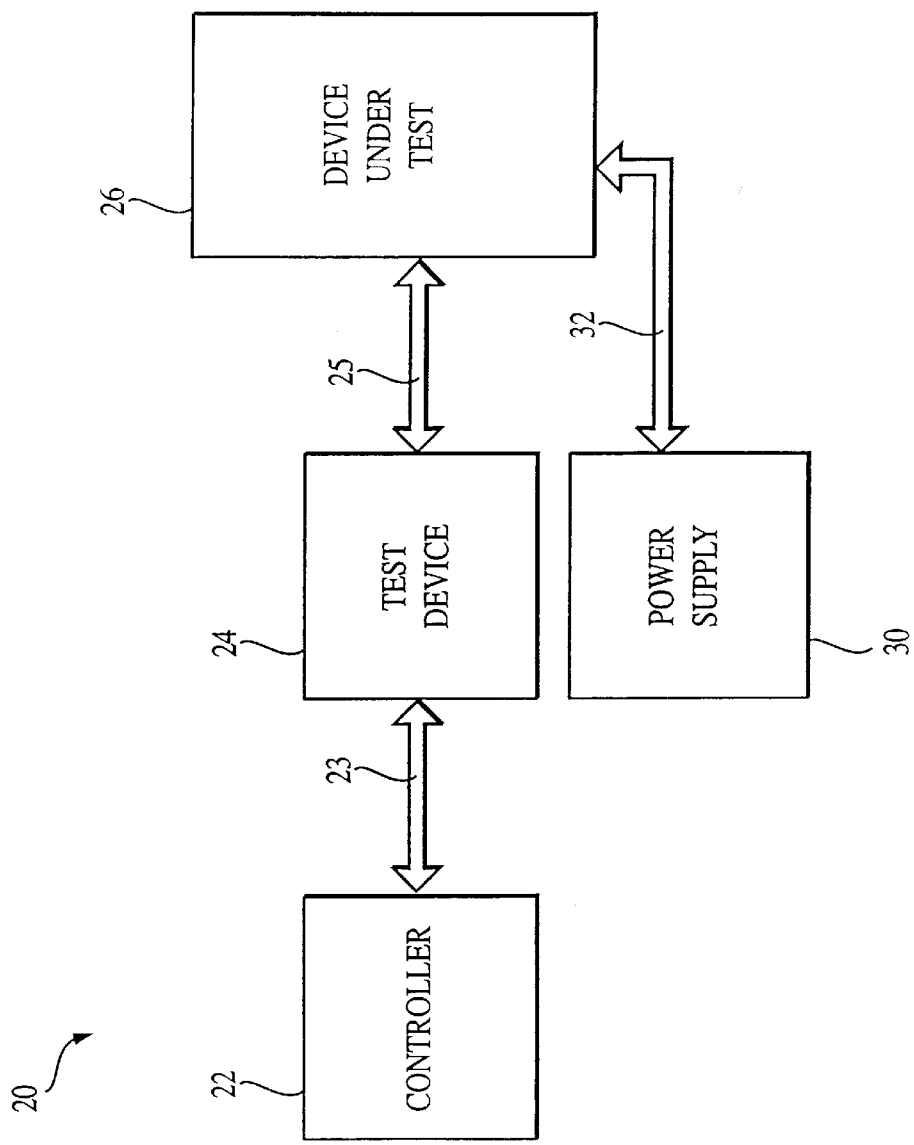
FIG. 1 illustrates in block diagram form a conventional test system for testing integrated circuits.

The present invention will be described as set forth in the preferred embodiments illustrated in FIGS. 3–7. Other embodiments may be utilized and structural or logical changes may be made without departing from the spirit or scope of the present invention. Like items are referred to by like reference numerals.

Figure 2:
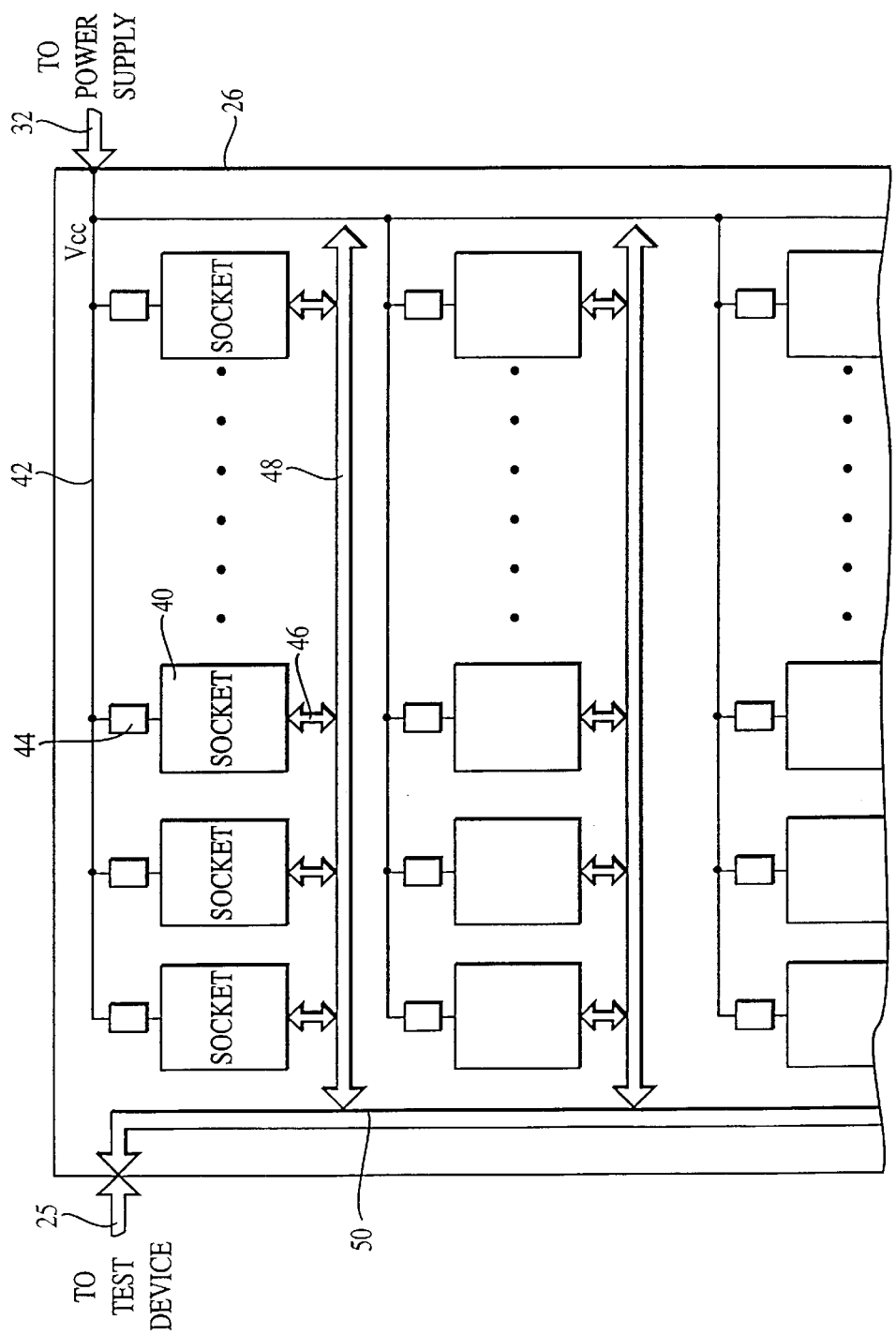
FIG. 2 illustrates in block diagram form a conventional test board used in the test system of FIG. 1.
Figure 3:
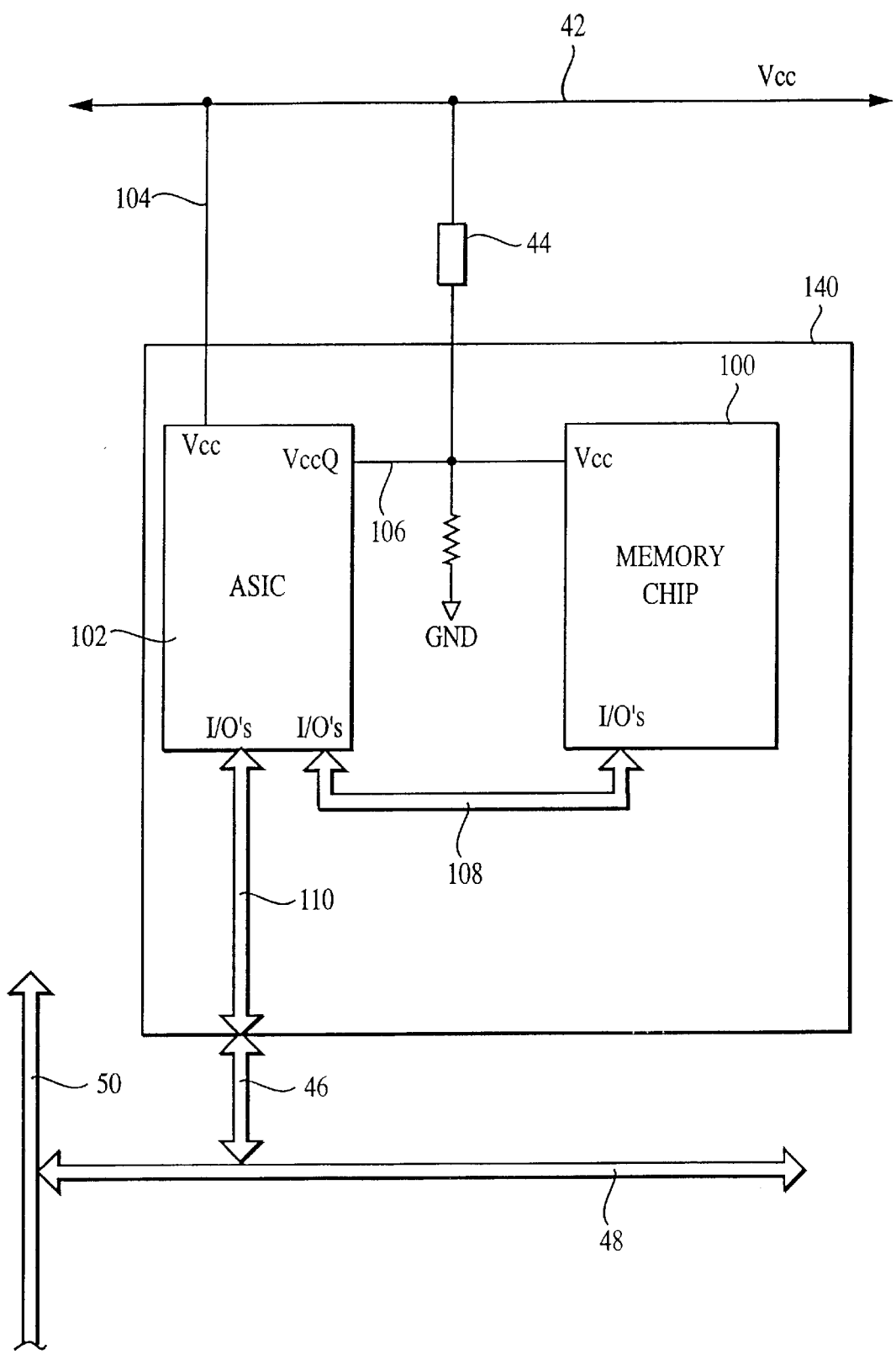
FIG. 3 illustrates in block diagram form a test socket in accordance with a first embodiment of the present invention.

FIG. 3 illustrates in block diagram form a socket 140 in accordance with a first embodiment of the present invention that can be used in the DUT board 26 of FIG. 2. Socket 140 is provided with power from Vcc line 42 through a protective device, such as for example fuse 44. Memory chip 100 is inserted into socket 140 for testing. Memory chip 100 is powered by Vcc via conductor 106.

In accordance with the present invention, a controller, such as ASIC 102, is built onto the DUT board 26 and associated with socket 140. The ASIC 102 may be located in socket 140, or alternatively may be located on the DUT board 26 near the socket 140. ASIC 102 is powered by Vcc line 42 via conductor 104. The voltage Vcc being input to memory chip 100 through fuse 44 is also input to ASIC 102 via conductor 106 on power pin VccQ. Power pin VccQ is typically provided on conventional ASIC's and requires a power source, such as Vcc, to enable the ASIC to drive the input/outputs (I/O's) on the ASIC.

The I/O's of memory chip 100 are connected to the I/O's of ASIC 102 by bus 108. The I/O's of the ASIC 102 are connected to test device 24 via bus lines 110, 46, 48 and 50.

The operation of the socket 140 is as follows. If fuse 44 has operated and is blown due to some high current condition, such as a fault condition, in memory chip 100, the voltage Vcc will not be input to Vcc pin of memory chip 100 and VccQ pin of ASIC 102. When the VccQ pin of ASIC 102 does not receive a supply voltage Vcc, the I/O's of ASIC 102 will not be enabled, i.e., they will be reliably disabled from transmitting or receiving any signals. Since the memory chip 100 is connected to the test device 24 through the ASIC 102, the memory chip 100 would also be disabled from transmitting to or receiving any signals from the test device 24. Since the I/O's of the ASIC 102 are disabled, the I/O's of memory chip 100 will not be carrying any signals from test device 24, and thus memory chip 100 will not be in a partially active state as in the conventional test sockets. Memory chip 100 will therefore be prevented from generating random data signals and outputting them to test device 24.

Thus, in accordance with the present invention, the memory chip 100 is reliably prevented from outputting random signals on the bus lines shared with other memory chips under test, thereby preventing erroneous readings by the test device 24 due to the random signals.

Figure 4:
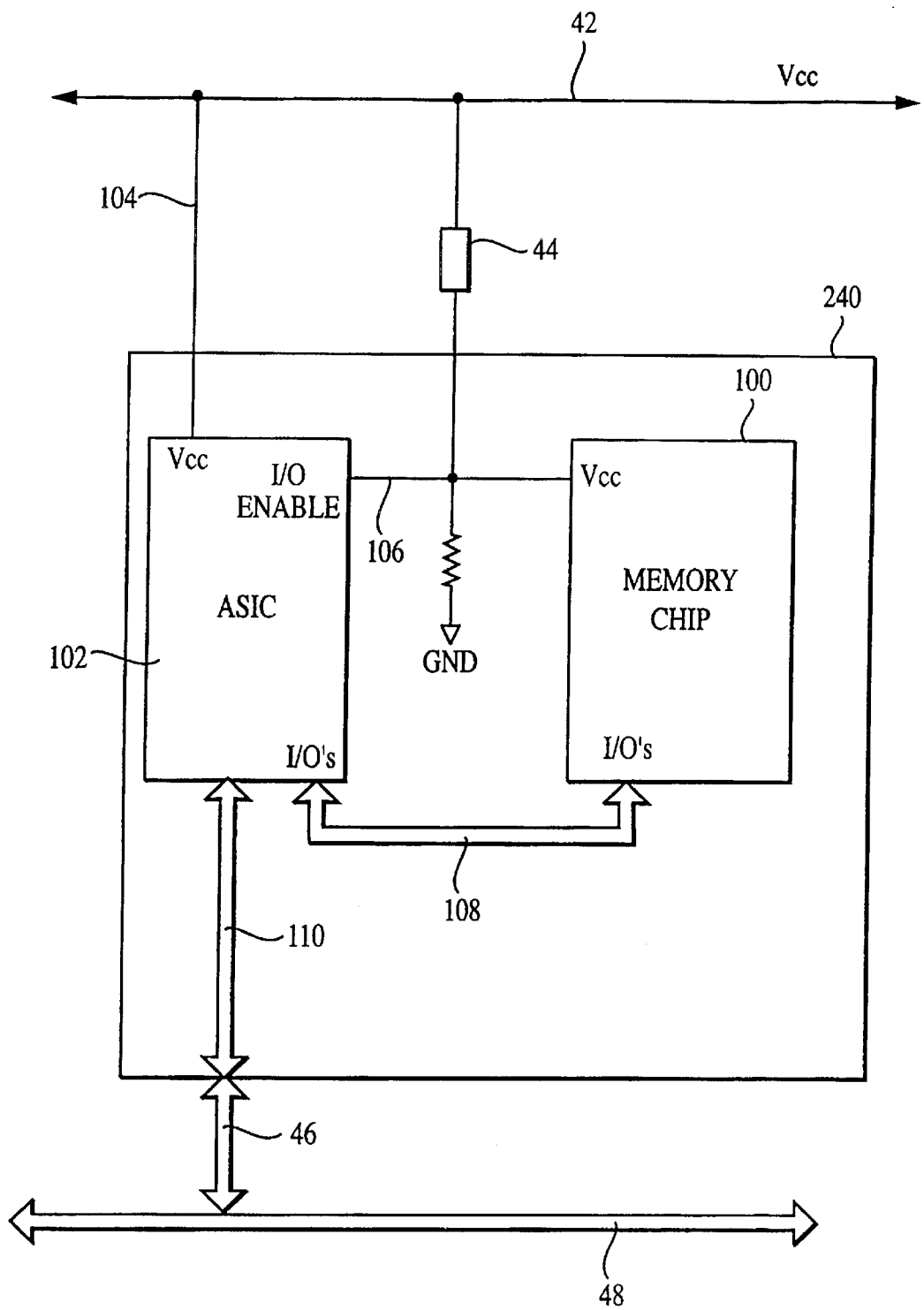
FIG. 4 illustrates in block diagram form a test socket in accordance with a second embodiment of the present invention.

FIG. 4 illustrates in block diagram form a socket 240 in accordance with a second embodiment of the present invention that can be used in the DUT board 26 of FIG. 2. Socket 240 is similar to socket 140 of FIG. 3 except for the following. The voltage Vcc being input to memory chip 100 through fuse 44 is also input to ASIC 102 via conductor 106 on an I/O Enable pin.

The operation of the socket 240 is as follows. A high logic signal, such as Vcc, input to the I/O Enable pin may enable the ASIC to drive the input/outputs (I/O's) on the ASIC. A low logic signal input to I/O Enable pin could cause the I/O's of the ASIC to be turned off. If the fuse 44 has not been blown, a high signal (Vcc) will be input to the I/O Enable pin of ASIC 102, thereby enabling the I/O's of ASIC 102 and connecting the I/O's of memory chip 100 to the test device 24. If fuse 44 is blown, a low signal (GND) will be input to I/O Enable pin of ASIC 102, thereby shutting off the I/O's of ASIC 102.

Since the memory chip 100 is corrected to the test device 24 through the ASIC 102, the memory chip 100 would also be disabled from transmitting to or receiving any signals from the test device 24. Since the I/O's of the ASIC 102 are disabled, the I/O's of memory chip 100 will not be carrying any signals from test device 24, and thus memory chip 100 will not be in a partially active state as in the conventional test sockets. Memory chip 100 will therefore be prevented from generating random data signals and outputting them to test device 24.

Figure 5:
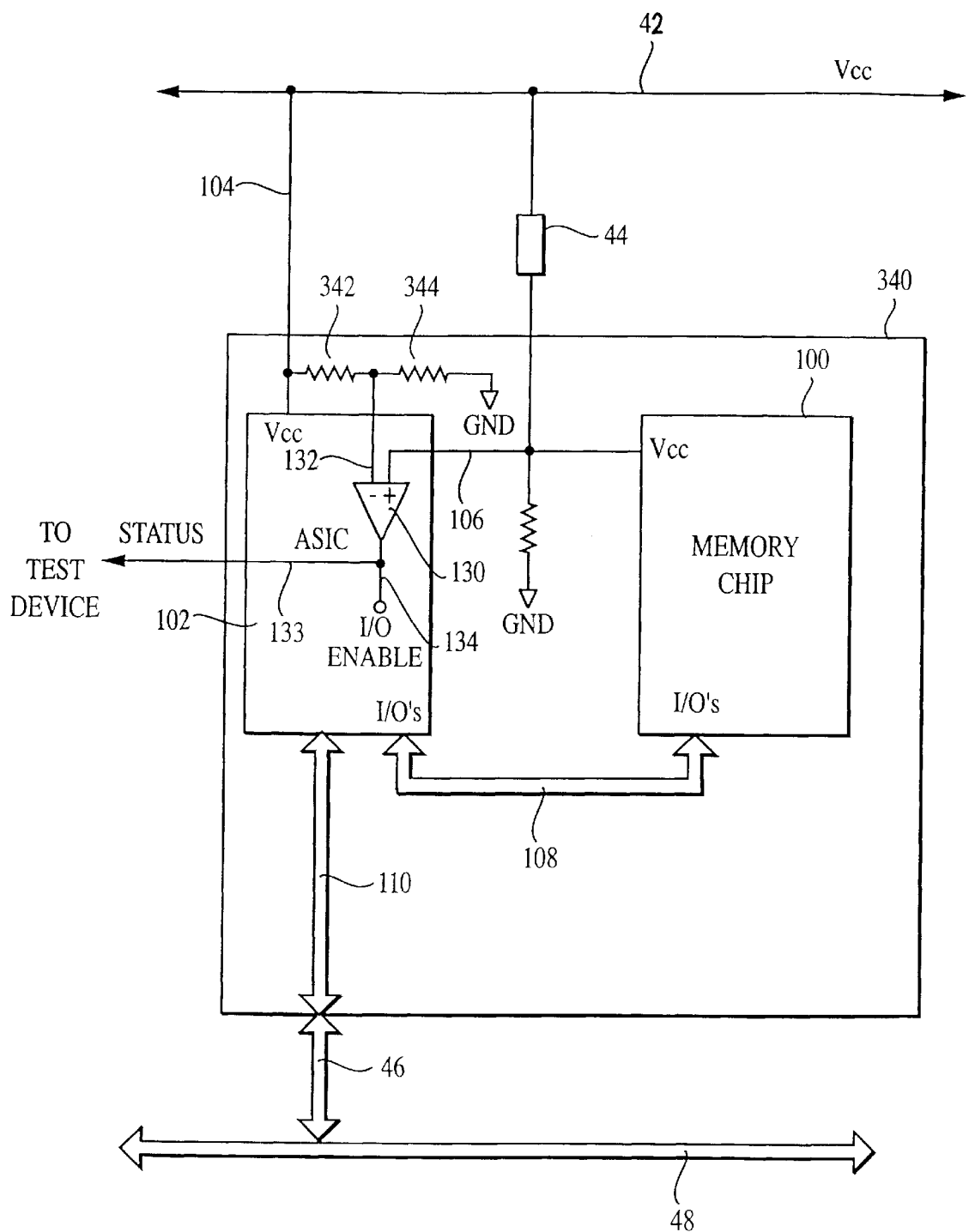
FIG. 5 illustrates in block diagram form a test socket in accordance with a third embodiment of the present invention.

FIG. 5 illustrates in block diagram form a socket 340 in accordance with a third embodiment of the present invention that can be used in the DUT board 26 of FIG. 2. Socket 340 is similar to socket 140 of FIG. 3 except for the following. The voltage Vcc being input to memory chip 100 through fuse 44 is also input to a first input of comparator 130 in ASIC 102 via conductor 106. The voltage Vcc is also input from conductor 104 to a second input of comparator 130 via conductor 132 through a voltage divider formed by resistors 342, 344. Alternatively, the voltage divider formed by resistors 342, 344 could be connected to any other line that carries Vcc instead of conductor 104. Resistors 342, 344 provide a suitable level for a reference voltage to be input to comparator 130 via conductor 132. The output 134 of comparator 130 is input to an I/O Enable pin of ASIC 102.

The operation of the socket 340 is as follows. The state of fuse 44 is determined by ASIC 102 by using comparator 130 to compare Vcc to the voltage level on the load side of fuse 44. For example, if fuse 44 is not blown, the signal level input to comparator 130 from conductor 106 may be greater than the reference voltage signal input to comparator 130 from conductor 132. The output of comparator 130, based on the value of the inputs, will input a signal to the I/O Enable pin of ASIC 102 which will enable the ASIC 102 to drive the I/O's of the ASIC 102. The I/O's of memory chip 100 will be connected to the test device through the enabled I/O's of ASIC 102.

If fuse 44 is blown, the level of the signal input to comparator 130 from conductor 106 may be less than the reference voltage signal input to comparator 130 from conductor 132. The resulting signal on output 134 of comparator 130 will disable the I/O's of ASIC 102. Since the memory chip 100 is connected to the test device 24 through the ASIC 102, the memory chip 100 would also be disabled from transmitting to or receiving any signals from the test device 24. Since the I/O's of the ASIC 102 are disabled, the I/O's of memory chip 100 will not be carrying any signals from test device 24, and thus memory chip 100 will not be in a partially active state as in the conventional test sockets. Memory chip 100 will therefore be prevented from generating random data signals and outputting them to test device 24.

Figure 6:
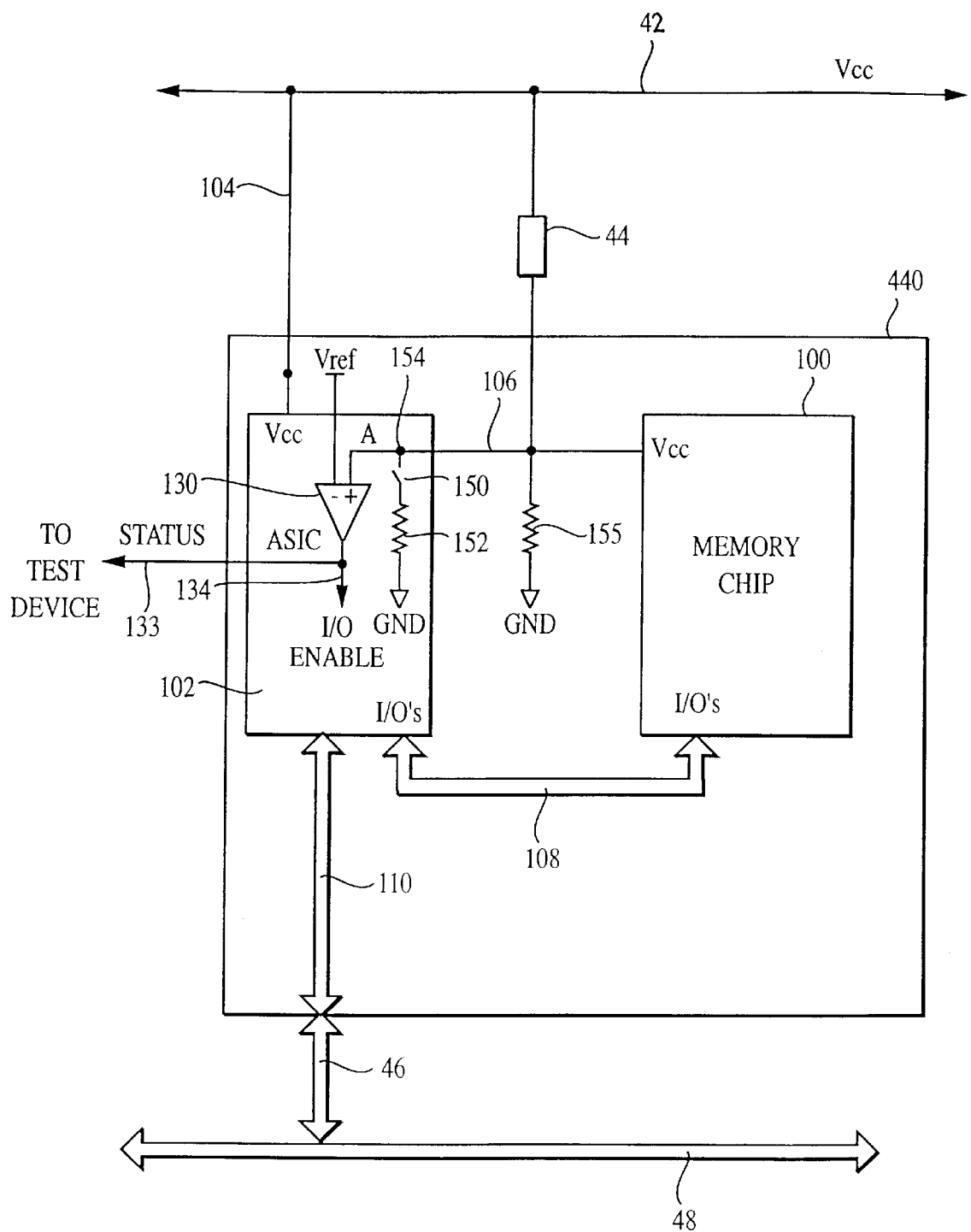
FIG. 6 illustrates in block diagram form a test socket in accordance with a fourth embodiment of the present invention.

FIG. 6 illustrates in block diagram form a socket 440 in accordance with a fourth embodiment of the present invention that can be used in the DUT board 26 of FIG. 2. Socket 440 is similar to socket 340 of FIG. 5 except for the following. The voltage Vcc being input to memory chip 100 through fuse 44 is also input to a first input of comparator 130 in ASIC 102 via conductor 106. Conductor 106 is tied to a reference voltage, preferably at ground (GND) potential, through a switch 150, such as for example a transistor, and a resistor 152. A reference voltage Vref is input to a second input of comparator 130. The output 134 of comparator 130 is input to an I/O Enable pin of ASIC 102.

The operation of the socket 440 is as follows. Utilizing a resistance determining circuit including comparator 130, switch 150 and resistors 152, 155, the resistance of fuse 44 can be determined, thus indicating the status of the fuse 44. Typically, the resistance across a fuse that has not been blown is very low, such as for for example a tenth of an ohm, while the resistance across a fuse that has blown is very high, ideally infinite. Additionally, in some instances a short high current spike through a fuse may degrade a fuse, i.e., increase its resistance, without blowing it completely. This can cause the resistance of the fuse to increase from, for example, 0.1 ohm anywhere up to 1 Megohm. Fuse resistances of greater than one ohm may cause significant drops in the supply voltage Vcc to the memory chip 100 being tested.

During normal operation, i.e., switch 150 is open, if fuse 44 is blown, the input to comparator 130 via conductor 106 will be pulled low by resistor 155. A low input on conductor 106 to comparator 130 will cause comparator 130 to output a signal on output 134 which will disable the I/O's of ASIC 102. If fuse 44 is not blown, the signal input to comparator 130 via conductor 106 will cause comparator 130 to output a signal on output 134 which will enable the I/O's of ASIC 102.

When a resistance measurement of fuse 44 is desired to be made to determine if fuse 44 has degraded significantly enough to affect the supply voltage Vcc being input to memory chip 100, switch 150 is closed. The resulting circuit forms a voltage divider between resistors 152, 155 and fuse 44. The voltage at node A 154 that is input to comparator 130 will be dependent upon the resistive value of fuse 44, the resistive value of resistors 152, 155 and the value of Vcc. Since the resistance of fuse 44 when it has not blown is known, and the resistance of resistors 152, 155 and the value of Vcc are also known, the value of Vref can be set to make output 134 of comparator 130 output a signal which enables the I/O's of ASIC 102 when the resistance of fuse 44 is below some predetermined level, such as for example one ohm. Similarly, if the fuse 44 has been degraded, comparator 130, based on the input signals Vref and node A 154 voltage, will output a signal that disables the I/O's of ASIC 102 when the resistance of fuse 44 is above the predetermined level.

Since the memory chip 100 is connected to the test device 24 through the ASIC 102, the memory chip 100 would also be disabled from transmitting to or receiving any signals from the test device 24. Since the I/O's of the ASIC 102 are disabled, the I/O's of memory chip 100 will not be carrying any signals from test device 24, and thus memory chip 100 will not be in a partially active state as in the conventional test sockets. Memory chip 100 will therefore be prevented from generating random data signals and outputting them to test device 24.

It is important to note that while the above embodiments have been described as having the I/O Enable signal internally enable or disable the I/O's of the ASIC 102, the invention is not so limited. For example, the output 134 of comparator 130 could be input to test device 24 via conductor 133 as a signal representing the status of the fuse 44. Test device 24, in response to the status signal on conductor 133 from output 134 of comparator 130, could determine the state of fuse 44 and adjust the test program accordingly by not sending any signals to the socket associated with that fuse 44.

Figure 7:
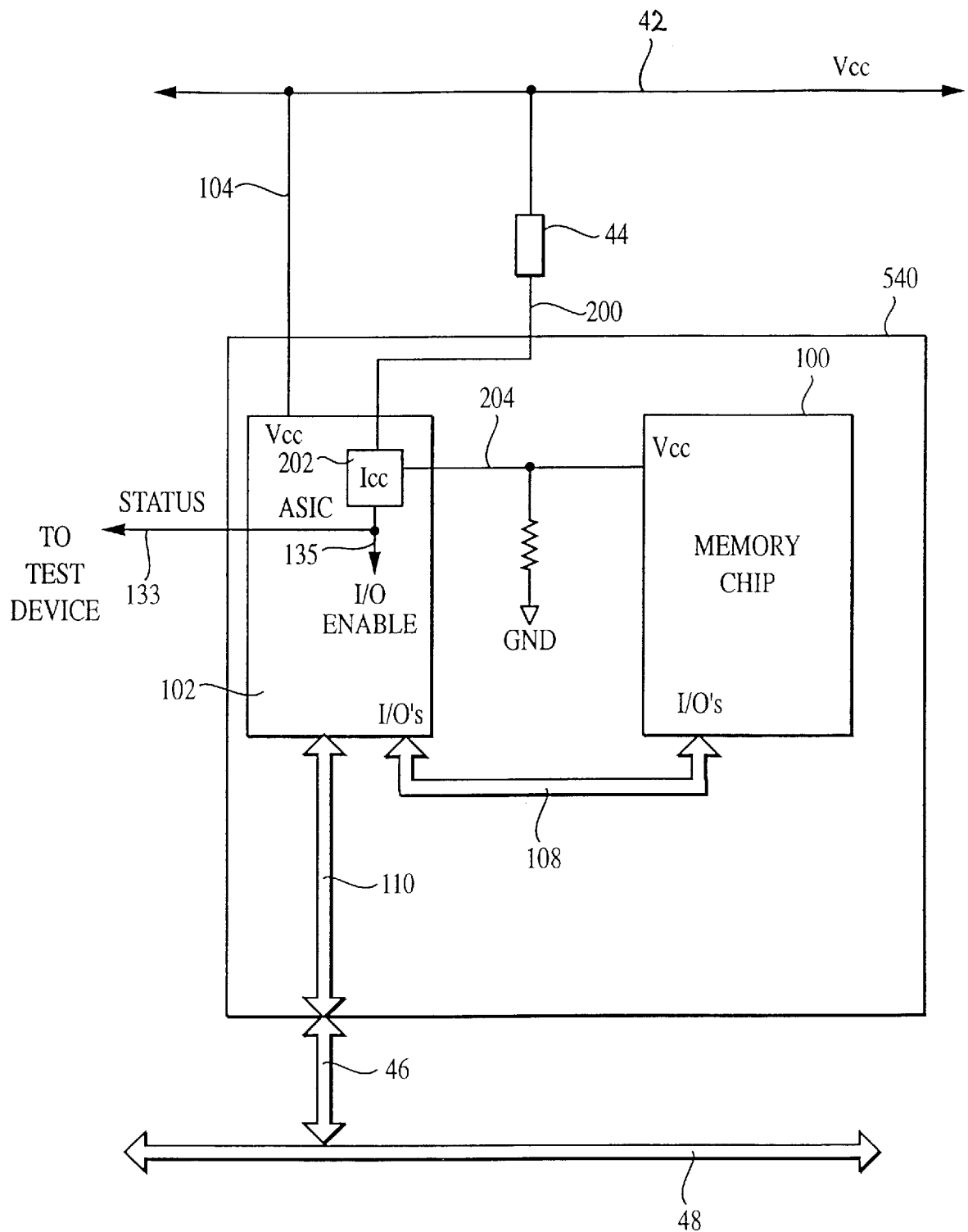
FIG. 7 illustrates in block diagram form a test socket in accordance with a fifth embodiment of the present invention.

FIG. 7 illustrates in block diagram form a socket 540 in accordance with a fifth embodiment of the present invention that can be used in the DUT board 26 of FIG. 2. Socket 540 is similar to socket 140 of FIG. 3 except for the following. The supply voltage Vcc from line 42 is input to memory chip 100 through fuse 44 and a current measuring device 202 in ASIC 102 via conductors 200 and 204.

The operation of socket 540 is as follows. Current measuring device 202 is used to measure the current that passes through the fuse 44 during testing of the memory chip 100. If fuse 44 is blown, no current will flow through measuring device 202. ASIC 102 may read the current measured by measuring device 202 via output 135, and should it be less than a predetermined reference level, indicating that fuse 44 has opened, disable the I/O's on ASIC 102.

Since the memory chip 100 is connected to the test device 24 through the ASIC 102, the memory chip 100 would also be disabled from transmitting to or receiving any signals from the test device 24. Since the I/O's of the ASIC 102 are disabled, the I/O's of memory chip 100 will not be carrying any signals from test device 24, and thus memory chip 100 will not be in a partially active state as in the conventional test sockets. Memory chip 100 will therefore be prevented from generating random data signals and outputting them to test device 24.

Alternatively, ASIC 102 may send a status signal to test device 24 indicating that the measured current through fuse is less than a predetermined reference level via conductor 133. Test device 24, in response to the status signal from ASIC 102, could determine the state of fuse 44 and adjust the test program accordingly by not sending any signals to the socket associated with that fuse 44.

While the above embodiments have been described as having a separate controller for each socket on the DUT test board 26, the invention is not so limited. A controller can be configured to monitor the fuses of any number of memory devices being tested, and is only limited by the number of pins on the controller. Thus, for example, a single controller, such as an ASIC 102, can be used to monitor one, two, three, four or any number of fuses. Furthermore, while the embodiments above have been described with respect to the testing of memory chip, the invention is not so limited and may be used to test any type of integrated circuit.

Thus, in accordance with the present invention, the state of the fuse that protects each socket on a test board is determined by a controller on the test board. When it is determined that a specific fuse is open, i.e., the fuse has blown due to some high current fault condition, the part inserted into the socket protected by the fuse will have its I/O lines disabled by the controller, thereby effectively shutting off the part completely and preventing it from generating and transmitting random data signals to the test device.

While preferred embodiments of the invention have been described and illustrated above, it should be understood that these are exemplary of the invention and are not to be considered as limiting. Additions, deletions, substitutions, and other modifications can be made without departing from the spirit or scope of the present invention. Accordingly, the invention is not to be considered as limited by the foregoing description but is only limited by the scope of the appended claims.

What is claimed as new and desired to be protected by Letters Patent of the United States is:

1. A test board for testing one or more of a plurality of integrated circuits, said test board comprising:
   a plurality of sockets, each of said plurality of sockets adapted to receive a respective one of said plurality of integrated circuits being tested, each of said plurality of integrated circuits having a respective plurality of input/output ports;
   a supply voltage conductor to carry a supply voltage for said plurality of sockets;
   a plurality of protective devices, each of said plurality of protective devices being associated with a respective one of said plurality of sockets and connected between said supply voltage conductor and said respective one of said plurality of sockets; and
   at least one controller, said at least one controller adapted to determine a state of each of said protective devices and to prevent signals from being transmitted from or received by a respective one of said plurality of integrated circuits in a socket if said socket's associated protective device has operated, said at least one controller further including a plurality of input/output ports, a first portion of said plurality of input/output ports being connected to said input/output ports of said respective one of said plurality of integrated circuits, a second portion of said plurality of input/output ports being connected to a test device,
   wherein said controller further comprises:
      an input pin connected to said supply voltage conductor through said associated protective device,
      said controller being adapted to enable one or more of said plurality of input/output ports of said controller if said associated protective device has not operated thereby inputting a supply voltage on said supply voltage conductor to said controller on said input pin,
      said controller being further adapted to disable one or more of said plurality of input/output ports of said controller if said associated protective device has operated and said supply voltage on said supply voltage conductor is not input to said controller on said input pin.

2. The test board according to claim 1, wherein said input pin is a power pin.

3. The test board according to claim 1, wherein said input pin is an enable pin.

4. A test board for testing one or more of a plurality of integrated circuits, said test board comprising:
   a plurality of sockets, each of said plurality of sockets adapted to receive a respective one of said plurality of integrated circuits being tested, each of said plurality of integrated circuits having a respective plurality of input/output ports;
   a supply voltage conductor to carry a supply voltage for said plurality of sockets;
   a plurality of protective devices, each of said plurality of protective devices being associated with a respective one of said plurality of sockets and connected between said supply voltage conductor and said respective one of said plurality of sockets; and
   at least one controller, said at least one controller adapted to determine a state of each of said protective devices and to prevent signals from being transmitted from or received by a respective one of said plurality of integrated circuits in a socket if said socket's associated protective device has operated, said at least one controller further including a plurality of input/output ports, a first portion of said plurality of input/output ports being connected to said input/output ports of said respective one of said plurality of integrated circuits, a second portion of said plurality of input/output ports being connected to a test device,
   wherein said controller further comprises:
      a resistance determining circuit, said state of said associated protective device being determined based upon a resistance of said associated protective device determined by said resistance determining circuit.

5. The test board according to claim 4, wherein said resistance determining circuit further comprises:
   a comparator having a first input connected to said supply voltage conductor through said associated protective device, a second input connected to a reference voltage, and an output;
   a resistor having a first end connected to a second reference voltage and a second end; and
   a switch connected between said first input of said comparator and said second end of said resistor.

6. The test board according to claim 5, wherein said second reference voltage is a ground potential.

7. The test board according to claim 5, wherein said switch is a transistor.

8. The test board according to claim 5, wherein if said associated protective device has not operated, said comparator will output a first signal on said output, said controller in response to said first signal enabling one or more of said plurality of input/output ports of said controller.

9. The test board according to claim 8, wherein if said associated protective device has operated, said comparator will output a second signal on said output, said controller in response to said second signal disabling one or more of said plurality of input/output ports of said controller.

10. The test board according to claim 5, wherein said output of said comparator is input to said test device.

11. The test board according to claim 10, wherein if said associated protective device has operated, said test device in response to a signal on said output of said comparator will adjust a test program being performed on said respective one of said plurality of integrated circuits by not sending any test signals to said respective one of said plurality of integrated circuits.

12. A test board for testing one or more of a plurality of integrated circuits, said test board comprising:
   a plurality of sockets, each of said plurality of sockets adapted to receive a respective one of said plurality of integrated circuits being tested, each of said plurality of integrated circuits having a respective plurality of input/output ports;
   a supply voltage conductor to carry a supply voltage for said plurality of sockets;
   a plurality of protective devices, each of said plurality of protective devices being associated with a respective one of said plurality of sockets and connected between said supply voltage conductor and said respective one of said plurality of sockets; and
   at least one controller, said at least one controller adapted to determine a state of each of said protective devices and to prevent signals from being transmitted from or received by a respective one of said plurality of integrated circuits in a socket if said socket's associated protective device has operated, said at least one controller further including a plurality of input/output ports, a first portion of said plurality of input/output ports being connected to said input/output ports of said respective one of said plurality of integrated circuits, a second portion of said plurality of input/output ports being connected to a test device,
   wherein said controller further comprises:
      a current measuring circuit adapted to measure a current passing through said associated protective device, said state of said associated protective device being determined based upon said measured current passing through said associated protective device.

13. The test board according to claim 12, wherein if said associated protective device has operated, said measured current through said associated protective device will be less than a predetermined level, and said controller will disable one or more of said input/output ports of said controller in response to said measured current being less than said predetermined level.

14. The test board according to claim 12, wherein if said associated protective device has operated, said measured current through said associated protective device will be less than a predetermined level, said controller in response to said measured current being less than said predetermined level outputting a control signal to said test device, said test device in response to said control signal adjusting a test program by not sending any test signals to said respective one of said plurality of integrated circuits.

15. The test system for testing one or more of a plurality of integrated circuits, said test system comprising:
   a test device to control testing of said one or more of a plurality of integrated circuits;
   a power supply to provide a supply voltage; and
   a test board connected to said test device and said power supply, said test board comprising:
      a plurality of sockets, each of said plurality of sockets adapted to receive a respective one of said plurality of integrated circuits being tested, each of said plurality of integrated circuits having a respective plurality of input/output ports;
      a supply voltage conductor to carry said supply voltage from said power supply to each of said plurality of sockets;
      a plurality of protective devices, each of said plurality of protective devices being associated with a respective one of said plurality of sockets and connected between said supply voltage conductor and said respective one of said plurality of sockets; and
      at least one controller, said at least one controller adapted to determine a state of each of said protective devices and to prevent signals from being transmitted from or received by a respective one of said plurality of integrated circuits in a socket if said socket's associated protective device has operated, wherein said controller further comprises:
         a plurality of input/output ports, a first portion of said plurality of input/output ports being connected to said plurality of input/output ports of said respective one of said plurality of integrated circuits, a second portion of said plurality of input/output ports being connected to a test device, and
         an input pin connected to said supply voltage conductor through said associated protective device,
      said controller being adapted to enable one or more of said plurality of input/output ports of said controller if said associated protective device has not operated thereby inputting said supply voltage on said supply voltage conductor to said controller on said input pin,
      said controller being further adapted to disable one or more of said plurality of input/output ports of said controller if said associated protective device has operated and said supply voltage on said supply voltage conductor is not input to said controller on said input pin.

16. The test system according to claim 15, wherein said input pin is a power pin.

17. The test system according to claim 16, wherein said input pin is an enable pin.

18. A test system for testing one or more of a plurality of integrated circuits, said test system comprising:
   a test device to control testing of said one or more of a plurality of integrated circuits;
   a power supply to provide a supply voltage; and
   a test board connected to said test device and said power supply, said test board comprising:
      a plurality of sockets, each of said plurality of sockets adapted to receive a respective one of said plurality of integrated circuits being tested, each of said plurality of integrated circuits having a respective plurality of input/output ports;
      a supply voltage conductor to carry said supply voltage from said power supply to each of said plurality of sockets;

a plurality of protective devices, each of said plurality of protective devices being associated with a respective one of said plurality of sockets and connected between said supply voltage conductor and said respective one of said plurality of sockets; and at least one controller, said at least one controller adapted to determine a state of each of said protective devices and to prevent signals from being transmitted from or received by a respective one of said plurality of integrated circuits in a socket if said socket's associated protective device has operated, wherein said controller further comprises:

a plurality of input/output ports, a first portion of said plurality of input/output ports being connected to said plurality of input/output ports of said respective one of said plurality of integrated circuits, a second portion of said plurality of input/output ports being connected to a test device, and a resistance determining circuit, said state of said associated protective device being determined based upon a resistance of said associated protective device determined by said resistance determining circuit.

19. The test system according to claim 18, wherein said resistance determining circuit further comprises:

a comparator having a first input connected to said supply voltage conductor through said associated protective device, a second input connected to a reference voltage, and an output;

a resistor having a first end connected to a second reference voltage and a second end; and a switch connected between said first input of said comparator and said second end of said resistor.

20. The test system according to claim 19, wherein said second reference voltage is a ground potential.

21. The test system according to claim 19, wherein said switch is a transistor.

22. The test system according to claim 19, wherein if said associated protective device has not operated, said comparator will output a first signal on said output, said controller in response to said first signal enabling one or more of said plurality of input/output ports of said controller.

23. The test system according to claim 22, wherein if said associated protective device has operated, said comparator will output a second signal on said output, said controller in response to said second signal disabling one or more of said plurality of input/output ports of said controller.

24. The test system according to claim 19, wherein said output of said comparator is input to said test device.

25. The test system according to claim 24, wherein if said associated protective device has operated, said test device in response to a signal on said output of said comparator will adjust a test program being performed on said respective one of said plurality of integrated circuits by not sending any test signals to said respective one of said plurality of integrated circuits.

26. A test system for testing one or more of a plurality of integrated circuits, said test system comprising:

a test device to control testing of said one or more of a plurality of integrated circuits;

a power supply to provide a supply voltage; and a test board connected to said test device and said power supply, said test board comprising:

a plurality of sockets, each of said plurality of sockets adapted to receive a respective one of said plurality of integrated circuits being tested, each of said plurality of integrated circuits having a respective plurality of input/output ports;

a supply voltage conductor to carry said supply voltage from said power supply to each of said plurality of sockets;

a plurality of protective devices, each of said plurality of protective devices being associated with a respective one of said plurality of sockets and connected between said supply voltage conductor and said respective one of said plurality of sockets; and at least one controller, said at least one controller adapted to determine a state of each of said protective devices and to prevent signals from being transmitted from or received by a respective one of said plurality of integrated circuits in a socket if said socket's associated protective device has operated, wherein said controller further comprises:

a plurality of input/output ports, a first portion of said plurality of input/output ports being connected to said plurality of input/output ports of said respective one of said plurality of integrated circuits, a second portion of said plurality of input/output ports being connected to a test device, and a current measuring circuit adapted to measure a current passing through said associated protective device, said state of said associated protective device being determined based upon said measured current passing through said associated protective device.

27. The test system according to claim 26, wherein if said associated protective device has operated, said measured current through said associated protective device will be less than a predetermined level, and said controller will disable one or more of said input/output ports of said controller in response to said measured current being less than said predetermined level.

28. The test system according to claim 26, wherein if said associated protective device has operated, said measured current through said associated protective device will be less than a predetermined level, said controller in response to said measured current being less than said predetermined level outputting a control signal to said test device, said test device in response to said control signal adjusting a test program by not sending any test signals to said respective one of said plurality of integrated circuits.

29. A method for testing one or more integrated circuits on a test board, said test board comprising a plurality of sockets each adapted to receive an integrated circuit being tested, each of said plurality of sockets being connected to a supply voltage through a respective protective device associated with each of said plurality of sockets, said test board further comprising at least one controller to monitor a status of one or more of said respective protective devices, said method comprising the steps of:

inserting an integrated circuit into at least one of said plurality of sockets;

determining said status of said protective device associated with said at least one of said plurality of sockets; and preventing test signals from being transmitted from or received by said integrated circuit in said at least one of said plurality of sockets if said associated protective device has operated, wherein said determining step further comprises:

connecting an input pin of said controller to said supply voltage through said respective protective device associated with said socket, inputting said supply voltage to said input pin if said associated protective device has not operated; and not inputting said supply voltage to said input pin if said associated protective device has operated.

30. A method for testing one or more integrated circuits on a test board, said test board comprising a plurality of sockets each adapted to receive an integrated circuit being tested, each of said plurality of sockets being connected to a supply voltage through a respective protective device associated with each of said plurality of sockets, said test board further comprising at least one controller to monitor a status of one or more of said respective protective devices, said method comprising the steps of:

inserting an integrated circuit into at least one of said plurality of sockets;

determining said status of said protective device associated with said at least one of said plurality of sockets; and preventing test signals from being transmitted from or received by said integrated circuit in said at least one of said plurality of sockets if said associated protective device has operated, wherein said determining step further comprises:

determining a resistance of said associated protective device.

31. A method for testing one or more integrated circuits on a test board, said test board comprising a plurality of sockets each adapted to receive an integrated circuit being tested, each of said plurality of sockets being connected to a supply voltage through a respective protective device associated with each of said plurality of sockets, said test board further comprising at least one controller to monitor a status of one or more of said respective protective devices, said method comprising the steps of:

inserting an integrated circuit into at least one of said plurality of sockets;

determining said status of said protective device associated with said at least one of said plurality of sockets; and preventing test signals from being transmitted from or received by said integrated circuit in said at least one of said plurality of sockets if said associated protective device, wherein said determining step further comprises:

measuring a current flowing through said associated protective device.

* * * * *

UNITED STATES PATENT AND TRADEMARK OFFICE
CERTIFICATE OF CORRECTION

PATENT NO. : 6,522,161 B1  Page 1 of 1
DATED : February 18, 2003
INVENTOR(S) : Aron T. Lunde et al.

It is certified that error appears in the above-identified patent and that said Letters Patent is hereby corrected as shown below:

Column 14,
Line 20, after "device", please insert -- has operated --.

Signed and Sealed this

Seventh Day of October, 2003

JAMES E. ROGAN
*Director of the United States Patent and Trademark Office*